United States Patent
Jones et al.

(10) Patent No.: US 6,590,417 B1
(45) Date of Patent: Jul. 8, 2003

(54) CASCADABLE BUS BASED CROSSBAR SWITCH IN A PROGRAMMABLE LOGIC DEVICE

(75) Inventors: Christopher W. Jones, Pleasanton, CA (US); Steven J. E. Wilton, Vancouver (CA)

(73) Assignee: Cypress Semiconductor Corporation, San Jose, CA (US)

( * ) Notice: Subject to any disclaimer, the term of this patent is extended or adjusted under 35 U.S.C. 154(b) by 0 days.

(21) Appl. No.: 09/825,899

(22) Filed: Apr. 3, 2001

(51) Int. Cl.$^7$ ............................................. H03K 19/177
(52) U.S. Cl. ............................. 326/39; 326/38; 326/40; 326/41; 326/47
(58) Field of Search ............................. 326/38, 39, 40, 326/41, 47

(56) References Cited

U.S. PATENT DOCUMENTS

| | | | |
|---|---|---|---|
| 5,811,985 A | * 9/1998 | Trimberger et al. | 326/38 |
| 5,847,579 A | * 12/1998 | Trimberger | 326/39 |
| 5,859,846 A | * 1/1999 | Kim et al. | 370/395.62 |
| 5,880,597 A | * 3/1999 | Lee | 326/38 |
| 6,034,541 A | * 3/2000 | Kopec et al. | 326/39 |
| 6,060,903 A | 5/2000 | Rangasayee | 326/39 |
| 6,154,050 A | * 11/2000 | Ma et al. | 326/38 |

* cited by examiner

*Primary Examiner*—Michael G. Lee
*Assistant Examiner*—Steven S. Paik
(74) *Attorney, Agent, or Firm*—Wagner, Murabito & Hao LLP

(57) ABSTRACT

A configurable crossbar switching circuit within a programmable logic device capable of efficient, large scale switching and for cascading for implementing much larger switching functions. In one embodiment of the invention, the crossbar switch is integral to a programmable logic device. In one embodiment, the crossbar switching circuit is bus based, switching all of the conductors constituting a data bus substantially simultaneously and in their entirety as a bus unit. In one embodiment, the crossbar switching circuit performs switching operations unidirectionally. For the implementation of larger scale switching functions, one embodiment of the present invention exploits the cascadable character of the crossbar switching circuit. Cascading crossbar switches enables switching between differing numbers of inputs and outputs, even exceeding capacities of individual crossbars. In one embodiment, a permutation subcircuit allows the configuration of signals within the crossbar switch to a designated, programmed sequence and specific order.

16 Claims, 13 Drawing Sheets

CASCADABLE BUS BASED CROSSBAR SWITCH IN A PROGRAMMABLE LOGIC DEVICE

BACKGROUND OF THE INVENTION

1. Field of the Invention

The present invention relates to the field of programmable logic devices. Specifically, the invention is designed to perform a cascadable bus based crossbar switching function.

2. Related Art

Programmable logic devices are often applied to perform switching functions. This utilization is especially prevalent in the field of data communications. Programmable logic device (PLD) structure, by design, is conducive to orderly data flowthrough, commonly via interconnected matrices of vertical and horizontal conductors. Interconnections are enabled in one modality by crossbar switching structures embedded within the PLD.

In performing switching functions, PLDs receive incoming data streams, route these streams according to a designed-in or field configured routing fabric, perform logic upon the data per a sequence of programmed instructions, switch the data streams to place them in a designated output configuration, and send off outgoing data streams to specified destinations accordingly.

Data streams predominantly flow through PLD structures in bus based modalities, rather than as individual bits. Most PLD based switching applications utilize simultaneous switching of buses of typically four, eight, ten, or sixteen wires, rather than individual wires. However, conventionally, data streams are switched by PLDs bit by bit, individually. Implementing a bit by bit switch is inefficient and costly. Conventional PLD switching implementations may contain small logic elements, each of which can be used to implement a single function of up to 4 inputs. FIG. 1 shows how a single switch 100CA with one-bit 16-input 12CA, one-output 13CA can be implemented using logic elements 4CA in accordance with-the conventional approach. To implement a ten-bit 16-input 16-output switch, 160 copies of the circuit 100CA in Conventional Art FIG. 1 are required (because there are 16 outputs, each with 10 bits).

The inefficiency of switching data streams by the conventional art adds expense to the switching function which manifests as lower than optimal switching speeds and demands on logic density. This results in architecture requiring a costly high logic density dedicated to switching, cascading layers of logic circuits for implementation of switching, and also results in outputs delayed by the cumulative, successive operation delays of each logic stage. Such high logic density mandated for dedication to switching functions ties up valuable circuit space and utilizes power then unavailable for other logic applications. Making conventional PLD switching circuits configurable exacerbates this problem. This further reduces efficiency and increases cost. These limitations impact applications requiring combinations of high speed, low switching dedicated logic density, low power consumption, and modest cost, and may preclude certain applications.

In the conventional art, as shown by U.S. Pat. No. 6,060,903, data streams flow through PLDs bi-directionally. Conventional Art FIG. 2 illustrates the approach taken in this conventional art. Both the vertical buses 101CA–V and horizontal buses 101CA–H therein may interchangeably carry input and output; thus input ports and output ports are interchangeable, and data streams may flow in any direction through the device. In this architecture, the ports of the bi-directional switches can be configured as either input ports or as output ports. However, bi-directional switches with combination input/output ports are relatively slow. While this offers some measure of flexibility, it is inefficient. Certain PLD switching applications may not require the bi-directionality offered in the conventional art, and thus may be encumbered by the restrictions in speed and other performance. These encumbrances limit certain PLD switching applications, and may repress some.

Certain switching applications utilizing PLDs require extremely large scale switching functions. In such applications, the number of inputs, the number of outputs, or both may exceed the capacity devoted to switching in a single PLD structure. In the conventional art, this constrains the application of single PLDs, demanding multistaging, which requires additional PLDs. In some applications, this constraint may be a barrier to large scale PLD switching.

Further, switching applications may require the fixing of the location of specific data signals in a specific order for output. Yet, switching within PLD structures generally disarrays order between inputs and outputs. Without the imposition of this order at the proper outputs, applications depending on orderly PLD switching and output are effectively precluded. Routing of signals through a PLD as the signals undergo switching therein conventionally poses a crucial problem to achieve this specified order at the designated locations.

SUMMARY OF THE INVENTION

Accordingly, what is needed is a configurable circuit, which allows bus based switching of data streams within programmable logic devices wherein data is switched at a bus level, each bus in its entirety, and which is optimized for switching many large buses. What is also needed is a circuit which performs switching within programmable logic devices wherein higher performance is achieved by limiting data flow, from input to output, to a single direction. Further, what is needed is a method and circuit thereof for cascading programmable logic device switching circuits with other such circuits, which enables switching on a scale much larger than would be possible with conventional switching. Further still, what is needed is a switching circuit for programmable logic devices which is configurable for designating a specific, fixed output signal order relative to the input signals.

The present invention provides a configurable circuit which allows bus based switching of data streams within programmable logic devices wherein data is switched at a bus level, each bus in its entirety, and which is optimized for switching many larger buses. The present invention also provides a circuit which performs switching within programmable logic devices wherein higher performance is achieved by limiting data flow, from input to output, to a single direction. Further, the present invention provides a method and circuit thereof for cascading programmable logic device switching circuits with other such circuits, which enables switching on a scale much larger than would be possible with conventional switching. Further still, the present invention provides a switching circuit for programmable logic devices which is configurable for designating a specific, fixed output signal order relative to the input signals.

One embodiment of the present invention provides a configurable crossbar circuit enabling bus based switching of data streams within programmable logic devices wherein data is switched at a bus level. This crossbar switching structure, in accordance with this embodiment, is optimized for switching many larger buses. In this embodiment, the crossbar circuit is embedded, as an integral part, within the programmable logic device. In the present embodiment, each data bus is switched in its entirety, as a bus unit. Bus based switching in accordance with the present embodiment of the present invention efficiently accords with the predominant flow of data through PLD is structures in bus based modalities. Bus based switching in accordance with the present embodiment implements higher performance switching, e.g., efficient switching at higher speeds, and with lower cost in terms of the logic density demanded by the switching function, itself. The configurability of the circuit in the present embodiment accords a useful measure of flexibility in the design of programmable logic device applications.

In another embodiment of the present invention, a configurable crossbar switching circuit performs switching within programmable logic devices wherein data flow, from an input to an output, is limited to a single direction. In this embodiment, at any given time, data may flow unidirectionally; e.g., data ports may not simultaneously function as inputs and outputs. Such unidirectional circuit operation yields higher performance in terms of switching speed and efficiency. Further, unidirectional switching may be performed without a complex circuit design, in as much as structure supporting bi-directional operation is obviated. The density of logic demanded by the switching application itself, is reduced accordingly in the present embodiment. This has the additional advantage of freeing up logic, circuit space, and power availability for other programmable logic device applications.

In a further embodiment, the present invention provides a method and circuit thereof for cascading programmable logic device switching circuits with other such circuits. In one implementation, a switching function is enabled is between a number of inputs, e.g., fewer than the number of inputs to which a single crossbar switch may be limited, and a number of outputs in excess of the number of outputs to which a single crossbar switch is limited. In another implementation, a switching function is enabled wherein switching is. accomplished between a number of inputs in excess of the number of inputs to which a single crossbar switch is limited and a number of outputs, e.g., fewer than the number of outputs to which a single crossbar switch may be limited. In yet another implementation, a switching function may be accommodated between a number of inputs and a number of outputs, both numbers in excess of the number of each to which a single crossbar switch may be limited.

The cascadability of programmable logic device crossbar switches enables switching on a scale much larger than would be possible with conventional switching. In accordance with this embodiment of the present invention, any number of inputs may be switched with any number of outputs by freely cascading crossbar switching circuits, one upon the other, in the design, fabrication, and configuration of crossbar switches embedded in programmable logic devices. Effectively, this cascading of individual, relatively small crossbar switches within a programmable logic device implements a larger switch.

In yet a further embodiment, the present invention provides a crossbar switching circuit for programmable logic devices which is configurable for designating a specific, fixed output signal order relative to the input signals. This has the advantage of permitting flexibility in circuit design and fabrication, and effectively broadens the application spectrum for programmable logic devices embedding crossbar switches incorporating the present embodiment.

These and other objects and advantages of the present invention will become obvious to those of ordinary skill in the art after reading the following detailed description of the preferred embodiments, which are illustrated in the various drawing figures.

BRIEF DESCRIPTION OF THE DRAWINGS

Conventional Art

Conventional Art

DETAILED DESCRIPTION OF THE INVENTION

Figure 1:
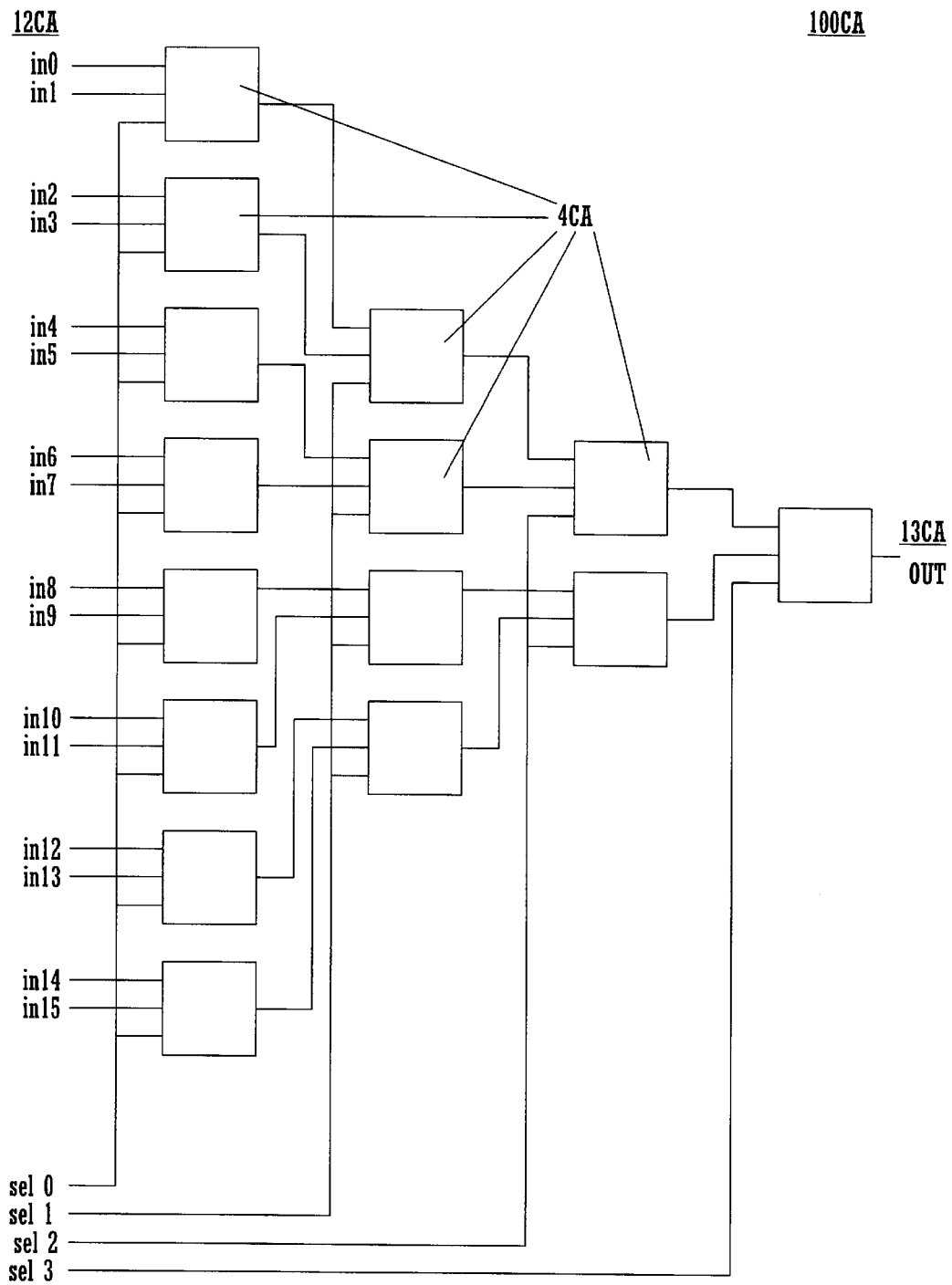
FIG. 1 depicts one method for implementing a 16-input, 1-output switch in a programmable logic device in accordance with the conventional art.
Figure 2:
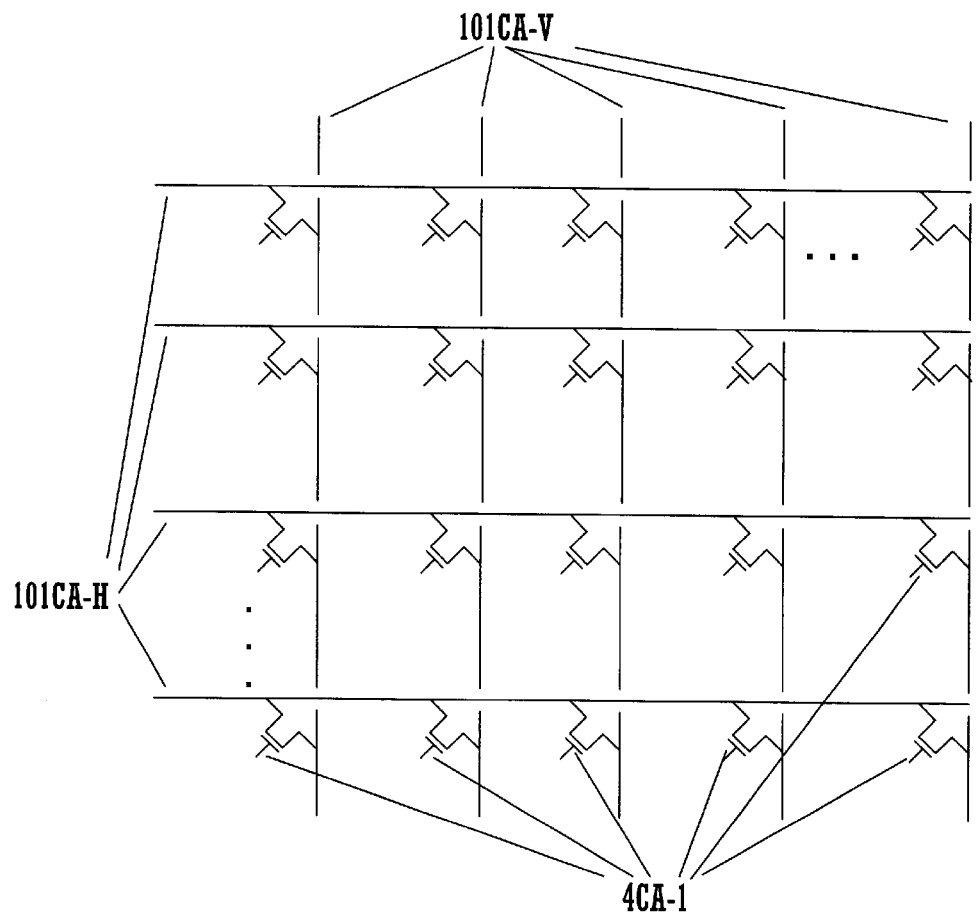
FIG. 2 depicts a bi-directional switching function implemented using programmable logic in a programmable logic device, in accordance with the conventional art.

Reference will now be made in detail to the preferred embodiments of the invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the appended claims. Furthermore, in the following detailed description of the present invention, numerous specific details are set forth in order to provide a thorough understanding of the present invention. However, it will be obvious to one of ordinary skill in the art that the present invention may be practiced without these specific details. In other instances, well-known methods, procedures, components, and circuits have not been described in detail so as not to unnecessarily obscure aspects of the present invention.

Notation and Nomenclature

Some portions of the detailed descriptions which follow may be presented in terms of procedures, logic blocks, processing, and other symbolic representations of operations on data bits within a programmable logic device, or other electronic device. These descriptions and representations are used by those skilled in the electronic arts to most effectively convey the substance of their work to others skilled in the art. A procedure, logic block, process, etc., is here, and generally, conceived to be a self-consistent sequence of steps or instructions leading to a desired result. The steps are those requiring physical manipulations of physical quantities. Usually, though not necessarily, these quantities take the form of electrical, electronic, or magnetic signals capable of being stored, transferred, combined, compared, and otherwise manipulated in an electronic system. It has proven convenient at times, principally for reasons of common usage, to refer to these signals as bits, bytes, values, elements, symbols, characters, terms, numbers, streams, or the like.

It should be borne in mind, however, that all of these and similar terms are to be associated with the appropriate physical quantities and are merely convenient labels applied to these quantities. Unless specifically stated otherwise as apparent from the following discussions, it is appreciate that throughout the present Invention, discussions utilizing terms such as "inputting," "feeding," "routing," "switching," "multiplexing," "configuring," "taking," "permuting," "outputting," "registering," "generating," "operating," "selecting," "providing," "corresponding," "performing," "cascading," "ranging," "having," "sequencing," "controlling," "interconnecting," "disbursing," "latching," "receiving," or the like, refer to the action and processes (e.g., processes 1100 of FIG. 9) of programmable logic devices, or similar intelligent electronic and/or microelectronic devices, that manipulate(s) and transform(s) data represented as physical (electronic) quantities within the devices' registers and subcomponents into other data similarly represented as physical quantities within the device subcomponents and registers and other such information storage, transmission or display capabilities.

Bus Based Crossbar Switch of the Present Invention

Figure 3:
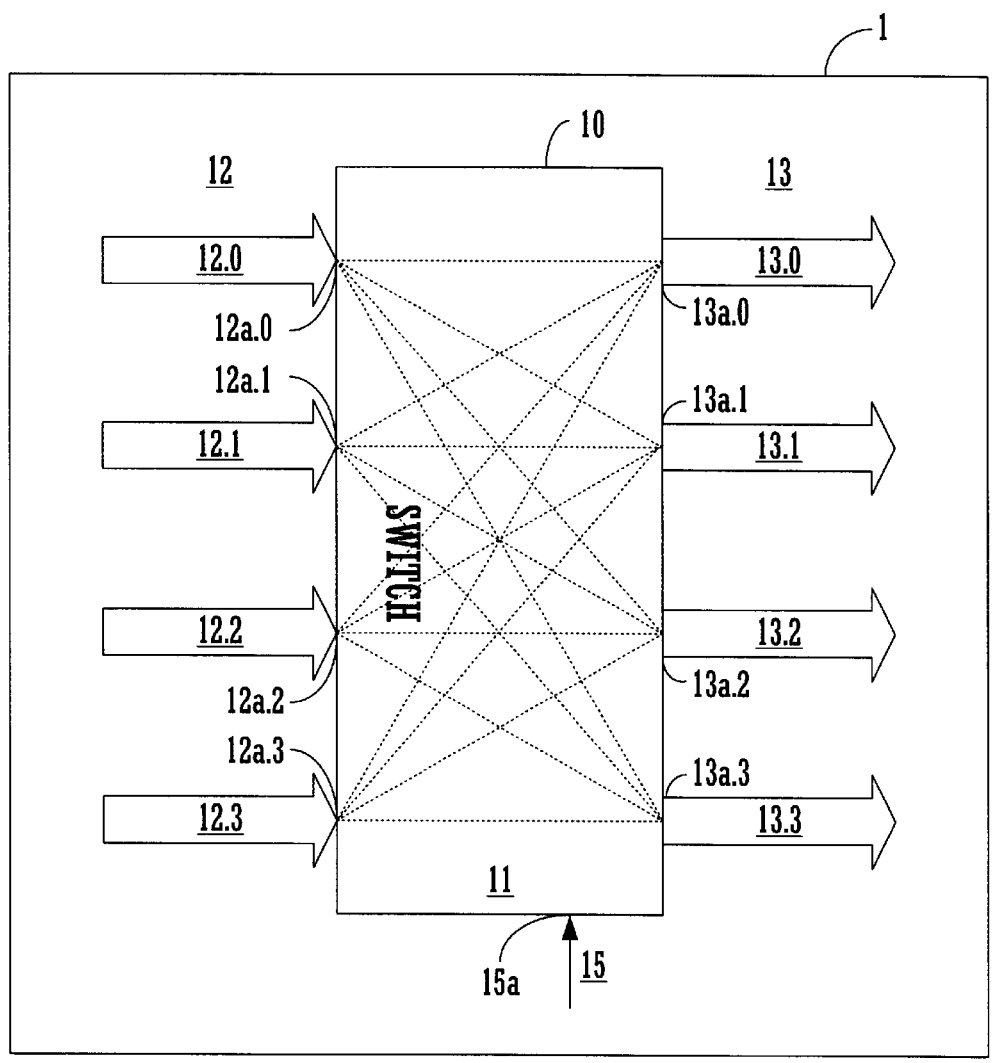
FIG. 3 depicts a conceptual view of a crossbar (XBAR) switching function in a programmable logic device, in accordance with one embodiment of the present invention.

FIG. 3 depicts the basic structure and operation of a crossbar switch 10, in accordance with one embodiment of the present invention. Crossbar switch 10 is configurable in the present embodiment to programmably interconnect incoming data buses 12, and outgoing data buses 13. Data buses 12 and 13 and crossbar switch 10 are embedded in a programmable logic device 1.

Data flows in packets of b bits, bundled and flowing within incoming buses 12.0 through 12.3, and within outgoing buses 13.0 through 13.3, in the present embodiment. In this embodiment, data from each of incoming data buses 12.0 through 12.3 enters switch 10, and is connected to pathways 11, via data bus input ports 12a, e.g., 12a.0 through 12a.3, respectively. Similarly, data leaves switch 10 in this embodiment via data bus output ports 13a, e.g., 13a.0 through 13a.3, on output buses 13.0 through 13.3, respectively. In the present embodiment, input ports 12a.0 through 12a.3 and output ports 13a.0 through 13a.3 are not functionally interchangeable. Thus, in accordance with the present embodiment, crossbar switch 10 is unidirectional.

Crossbar switch 10 of FIG. 3, in accordance with this embodiment, provides a network of programmable switching pathways 11 through it. Switching pathways 11 interconnect any incoming data bus 12, with any outgoing data bus 13. In the present embodiment, for a number n of incoming buses 12 and of outgoing buses 13, the number of switching pathways 11 possible is equal to $n^2$.

Figure 6:
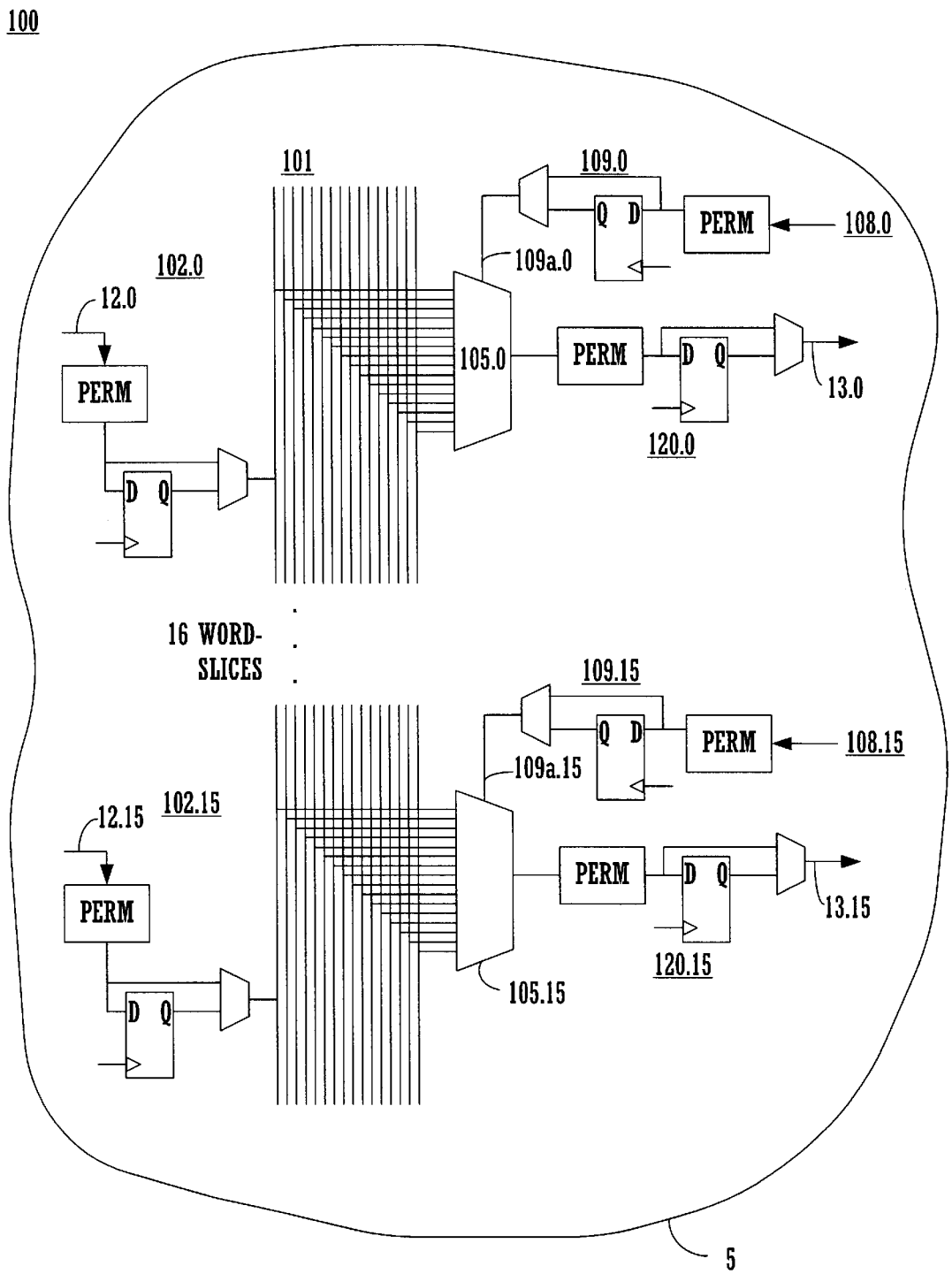
FIG. 6 depicts an overview of the bus based crossbar switching structure depicted in a programmable logic device, in one implementation of the present invention.
Figure 7:
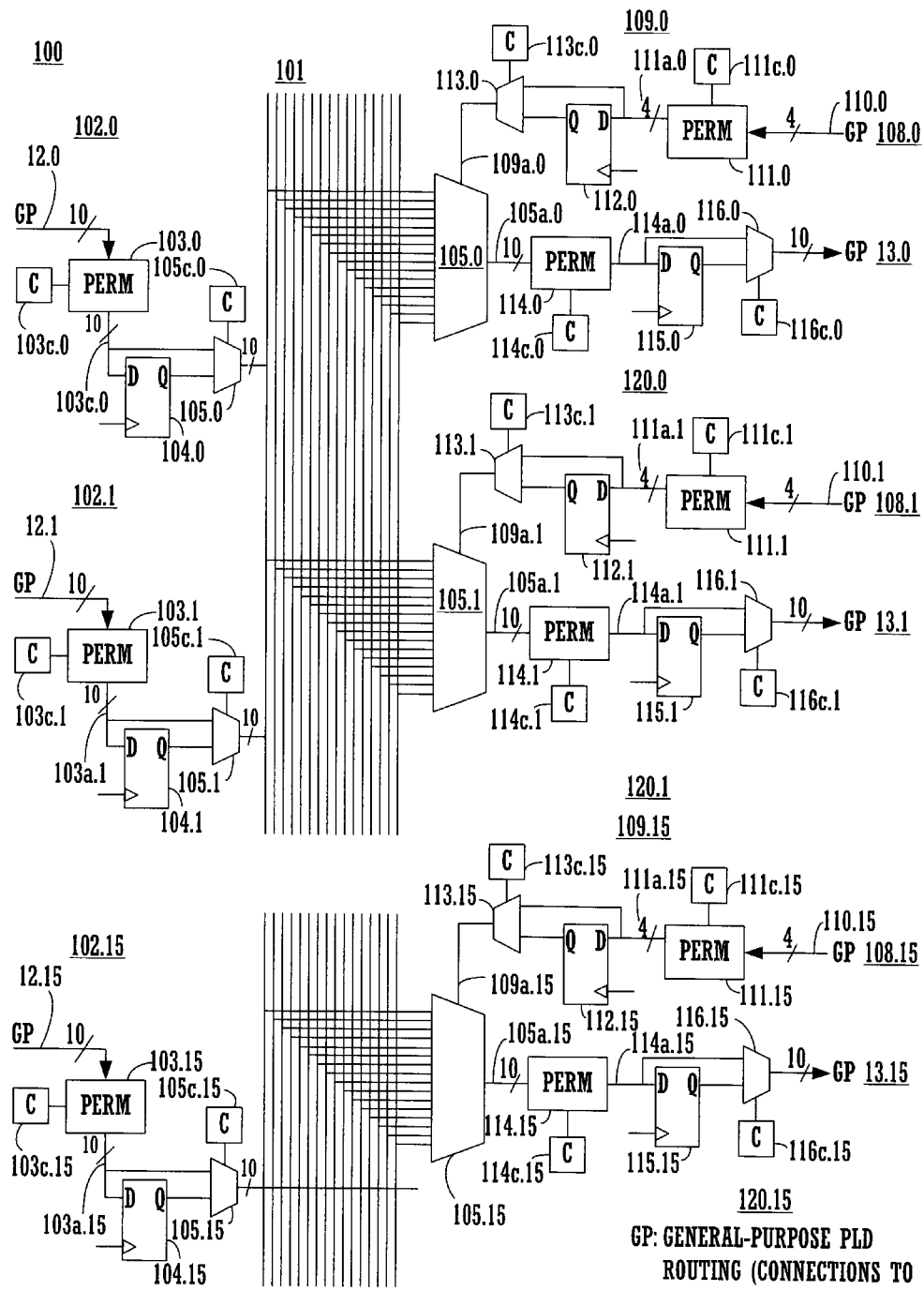
FIG. 7 is a detailed circuit diagram of a bus based crossbar switch circuit embedded in a programmable logic device in accordance with one embodiment of the present invention.

This array of programmable interconnections, e.g., switching pathway network 11, thus enables the transfer of data streams flowing on any incoming data bus 12 to any outgoing data bus 13, effectively switching the flow of data. Interconnections 11 represent possible paths between these data streams. Which paths are active depends on header information contained in the data passing through the switch and changes during operation of the switch. In the present embodiment, the number and configuration of switching pathway network 11 is programmable by configuration bits 15. In an alternative embodiment, the number and configuration of network 11 is controlled by select line signals 109a (FIGS. 6, 7).

In the present embodiment, switching accomplished by crossbar switch 10 via pathways 11 is bus based. A whole stream of data inputted from any input bus 12 is switched in its entirety by crossbar switch 10 to a single output bus 13. Advantageously, crossbar switch 10 does not enable bit-by-bit switching; in the present embodiment, it is bus based. Switching functions in programmable logic devices implemented according to the present embodiment, utilizing configurable, unidirectional, bus based crossbar circuits, is considerably more efficient and significantly faster than the conventional application of logic elements.

Figure 4:
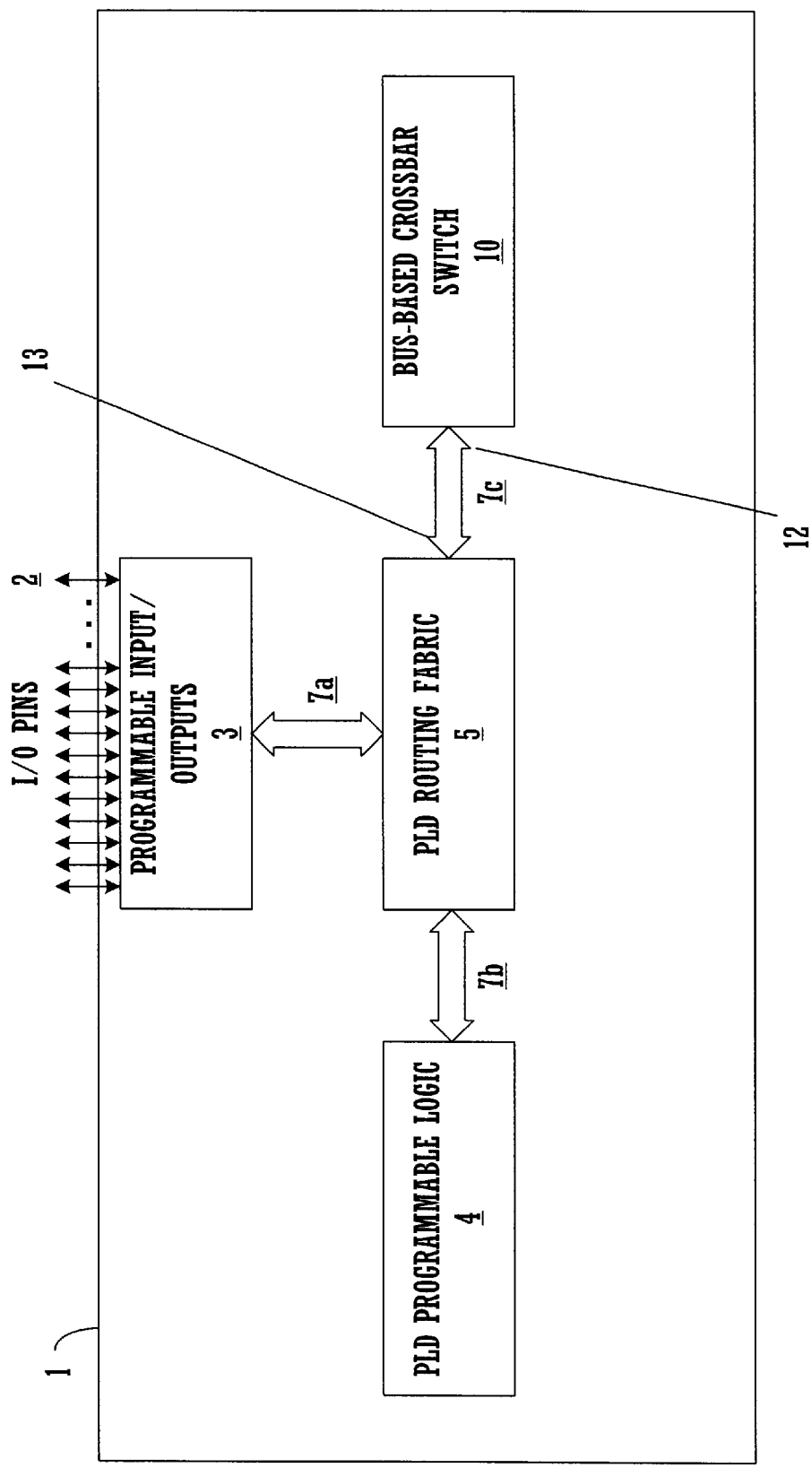
FIG. 4 is a block diagram of a programmable logic device with an embedded crossbar switching structure, programmable inputs/outputs and logic, and a routing fabric, in accordance with one embodiment of the present invention.

FIG. 4 depicts the functional relationship between bus based crossbar switch 10 and other integral, functional components of an exemplary programmable logic device (PLD) 1, in accordance with one embodiment of the present invention. Embedded within PLD 1 in this embodiment are an input/output stage 3, programmable logic elements 4, a routing fabric 5, and bus, based, unidirectional crossbar switch 10. Exemplary programmable logic device 1 communicates data via input/output (I/O) pins 2.

Communication of data by programmable logic device 1 is regulated by input/output (I/O) stage 3, to which I/O pins 2 are connected. The regulation of data communication is a programmable feature of I/O stage 3. Programming may be configurable, in one embodiment. Alternatively, in another embodiment, programming may be field programmable by a user. Data 7a to be received or transmitted by I/O stage 3 is routed in one embodiment of the present invention to the other functional components of programmable logic device 1 by a routing fabric 5. Routing fabric 5 also routes data flow between the other functional components of PLD 1, including data flow 7b to and from programmable logic elements 4.

Routing fabric 5 also transports data flow 7c to and from crossbar switch 10. In this embodiment, data flow 7c includes data streaming on input buses 12 and on output buses 13. Routing fabric 5 also channels configuration controlling select line configuration signals 108 (e.g., 108.0 through 108.15, FIGS. 6, 7).

Figure 5:
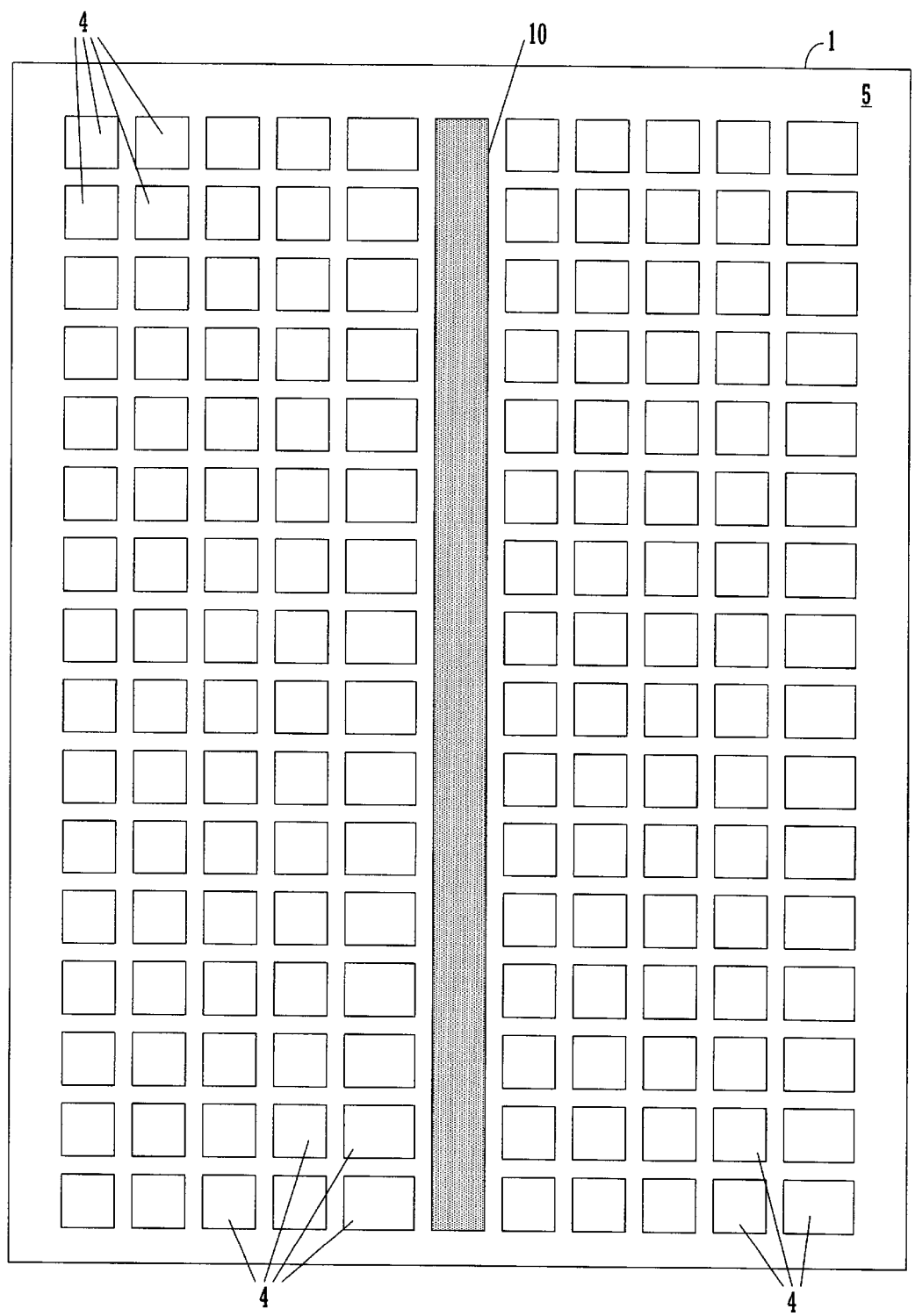
FIG. 5 depicts the gross cross sectional structure of a programmable logic device incorporating an embedded bus based crossbar switching structure, in accordance with one embodiment of the present invention.

FIG. 5 depicts the gross cross-sectional structural relationship between embedded elements of PLD 1 in accordance with one embodiment of the present invention. Routing fabric 5 is depicted as a matrix interconnecting logic elements 4 and cross bar switch structure 10.

Although FIG. 5 only shows one crossbar structure 10, it is appreciated that, in other embodiments, any number of such structures may be embedded in a PLD 1. With reference to FIG. 5, crossbar structure 10 is oriented vertically in this embodiment. It is also to be appreciated that in other embodiments, other orientations of the crossbar structure 10 are possible.

Crossbar structure 10 in this embodiment spans 16 of logic elements 4. In other Implementations, it is to be further appreciated that other sizes of crossbar structure 10, may span a greater or fewer number of logic elements 4.

In the discussion below, logic elements 4, as spanned by crossbar structure 10, may be alternatively referred to as a word-slice 4.

FIG. 6 depicts an overview of a circuit 100 that makes up the crossbar structure 10 (FIGS. 3–5), in accordance with one embodiment of the present invention. A central component of crossbar circuit 100 is a set of sixteen vertical 10-bit buses 101 that span the entire height of the crossbar structure 10. It is to be appreciated that crossbar circuit 100 may be implemented in other sizes and bus widths.

In the present embodiment, each of buses 101 is driven in one place by the general-purpose PLD routing fabric 5 (FIGS. 4, 5). PLD routing fabric 5 is used to connect the logic elements 4 (FIGS. 4, 5) and crossbar structure 10 within the PLD 1 (FIGS. 3–5) to each other.

Crossbar circuit 100 receives input data via connections to logic elements 4 (FIG. 5) in general purpose PLD routing fabric 5. In this implementation, each vertical bus 101 receives data input on an input bus 12 via an input subcircuit 102; there are 16 inputs, 12.0 through 12.15, and 16 input subcircuits, 102.0 through 102.15.

In the present embodiment, crossbar circuit 100 contains sixteen 16-input 10-bit multiplexer (MUX) stages 105, shown as MUX stages 105.0 through 105.15. Each MUX stage 105 is constituted by ten individual, embedded MUXs. Each MUX stage is used to select one of the sixteen vertical buses 101, respectively, under control of a line select signal 108 (e.g., 108.0 through 108.15). Line control select signals 108.0 through 108.15 are each delivered by select line controllers 109.0 through 109.15, respectively.

Crossbar circuit 100 exports output data via connections to logic elements 4 (FIG. 5) in general purpose PLD routing fabric 5 (FIGS. 4–6). Each MUX stage 105 provides a data output on an output bus 13 (e.g., 13.0 through 13.15) via an output subcircuit 120 (e.g., 120.0 through 120.15). In the present embodiment, the output of each MUX stage 105 spans 10 bits; each bit is generated by one of the individual MUXs embedded within the MUX stage 105.

With reference to FIG. 7, a crossbar circuit 100 of one embodiment of the present invention is considered in detail.

As in the embodiment depicted in FIG. 6, a central component of crossbar circuit 100 of the present embodiment is a set of sixteen vertical 10-bit buses 101 that span the entire height of the crossbar structure 10 (FIGS. 3–5). Each 10-bit bus 101 spans 16 word slices, e.g., logic elements 4 (FIG. 5), connected via routing fabric 5 (FIGS. 4–6). It should be appreciated that crossbar circuit 100 may be implemented in other sizes and bus widths.

In one embodiment, each of vertical buses 101 receive input data from. respective input buses 12.0 through 12.15, from respective input subcircuits, 102.0 through 102.15, directly via permutating devices (PERMs) 103.0 through 103.15, respectively. Permutating devices 103.0 through 103.15 configure the data according to program configuration bits 103c.0 through 103c. 15, and respectively generate permuted outputs 103a.0 through 103a.15, respectively.

Alternatively, in another implementation, each of input buses 12.0 through 12.15 may be respectively registered by input subcircuits 102.0 through 102.15 via latches 104.0 through 104.15. In the alternative embodiment, the configured outputs from permutation devices 103.0 through 103.15 and the registered outputs of latches 104.0 through 104.15 are respectively multiplexed by multiplexers 105.0 through 105.15 into input data signals 106.0 through 106.15 for input to each respective vertical bus 101.

In the present embodiment, crossbar circuit 100 contains sixteen 16-input 10-bit multiplexer (MUX) stages 105, e.g., MVX stages 105.0 through 105.15. Each MUX stage 105 (e.g., 105.0 through 105.15) Is constituted by ten individual, embedded MUXs. Each MUX stage 105 is used to select one of the sixteen vertical buses 101, respectively. Which bus is selected is under control of a line select signal 108 (e.g., 108.0 through 108.15) delivered by a select line controller 109 (e.g., 109.0 through 109.15). Each MUX stage 105 has a single, 10-bit wide output 105a, e.g., 105a.0 through 105a.15.

Select line controllers 109.0 through 109.15 may utilize permutating devices (PERMs) 111.0 through 111.15, latches 112.0 through 112.15, and MUXs 113.0 through 113.15, respectively. Select line controllers 109.0 through 109.15 receive line select signals 108.0 through 108.15 at PERMs 111.0 through 111.15, respectively, via general purpose PLD 1 routing fabric 5 (FIGS. 4–6). In the present embodiment, there are four select lines 110 for each MUX stage 105; these select lines are driven by the general-purpose routing fabric 5 (FIGS. 4–6).

In one embodiment, MUX stages 105.0 through 105.15 receive select line control signals 109a.0 through 109a.15, respectively, from select line controllers 109.0 through 109.15, respectively, directly via permutating devices 111.0 through 111.15, respectively, as permuted line select signals 111a.0 through 111a.15, respectively. Permutating devices 111.0 through 111.15 respectively generate permuted line select signals 111a.0 through 111a.15 by respectively configuring line select signals 108.0 through 108.15 according to program configuration bits 111c.0 through 111c.15.

Alternatively, in another implementation, each permuted line select signal 111a.0 through 111a.15 may be respectively registered by latches 112.0 through 112.15. In the alternative embodiment, the configured outputs 111a.0 through 111a.15 from permutation devices 111.0 through 111.15, respectively, and the registered outputs of latches 112.0 through 112.15 are multiplexed by MUXs 113.0 through 113.15, respectively, into MUX control signals 109a.0 through 109a.15, respectively. MUX stages 105.0 through 105.15 are respectively responsive to MUX control signals 109a.0 through 109a.15.

The output lines 105a, one from each MUX stage 105, each spanning ten bits (each bit generated by one of the individual MUXs embedded within MUX stage 105), are connected to a single 10-bit wide output port 13a (e.g., FIG. 3) via output circuits 120.0 through 120.15, respectively. The respective output ports 13a may be connected to the rest of PLD 1 using the general-purpose routing fabric 5 (FIGS. 4–6). Output circuits 120.0 through 120.15 may utilize permuting devices 114.0 through 114.15, latches 115.0 through 115.15, and MUXs 116.0 through 116.15, respectively.

The outputs of each MUX stage 105, e.g., 105a.0 through 105a.15, each spanning 10 bits (each bit generated by one of the individual MUXs embedded within MUX stage 105), are respectively received by permutating devices (PERM) 114.0 through 114.15. PERMs 114.0 through 114.15 respectively configure data 105a.0 through 105a.15 according to program configuration bits 114c.0 through 114c.15, such that the permuted outputs 114a.0 through 114a.15 are configured to conform to the bit sequence of the data stream inputted to each bus 101. In one embodiment, permuted outputs 114a.0 through 114a.1 5 may be respectively exported directly via output ports 13a (e.g., FIG. 3) as outputs 13.0 through 13.15. Alternatively, in another implementation, each permuted output 114a.0 through 114a.15 may be respectively registered by latches 115.0 through 115.15.

In the alternative embodiment, the configured outputs 114a.0 through 114a.15 from PERMs 114.0 through 114.15, respectively, and the registered outputs of latches 115.0 through 115.15 are respectively multiplexed by MUXs 116.0 through 116.15 into output data signals 13.0 through 13.15, for export via output ports 13a (e.g., FIG. 3). MUXs 116.0 through 116.15 are respectively responsive to program configuration bits 116c.0 through 116c.15.

It is appreciated that each Input bus 12, output lines 105a, and select lines bus 110 passes through a permute block, e.g., permutation devices 103, 114, and 111, respectively. Each permute (PERM) block (e.g., 103, 114, and 111) has a single bus (e.g., 12, 105a, and 110, respectively) input and a single bus (e.g., 103a, 114a, and 111a, respectively) output. Each PERM block (e.g., 103, 114, and 111) can be used to connect each bit of a PERM output bus to any bit of the PERM Input; e.g., different output bits can be connected to different input bits. In this way, it can be used to "permute," e.g., to configure permutationally, the bits within a bus. It should be appreciated that, unlike the 16-input muitiplexer stages 105, the select lines of each PERM block are driven by programmable configuration bits (not from the general-purpose routing fabric 5). Therefore, once the PLD 1 (FIGS. 3–5) chip has been configured, the connections within each PERM block (e.g., 103, 114, and 111) will not vary.

It should also be appreciated that input ports 12a (e.g., FIG. 3), output ports 13a (e.g., FIG. 3), and select line ports 15a (e.g., FIG. 3), connecting crossbar circuit 100 within PLD 1 may be connected directly to the general-purpose PLD 1 logic, e.g., to word slices 4 (FIG. 5) through the general purpose PLD 1 routing fabric 5 (FIGS. 4–6). It should be appreciated further that general-purpose PLD 1 logic may be used to implement crossbar switch 100 functions, including, but not limited to packet processing, and may be used to implement any conceivable switching protocol.

Figure 8:
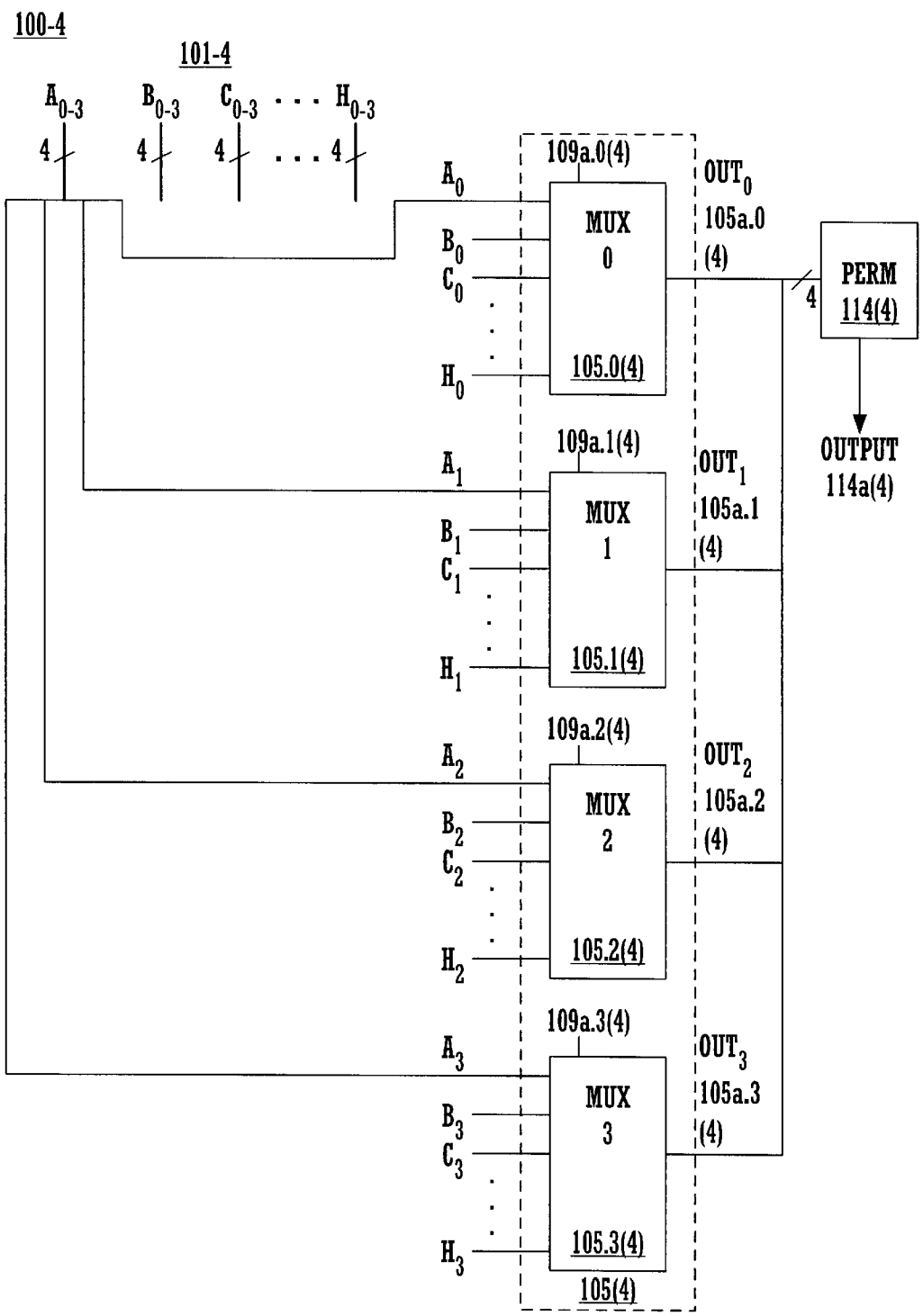
FIG. 8 depicts the bus, data channel, and input/output details of a multiplexer stage and permutation device of crossbar switching circuit for a programmable logic device, in one implementation of the present invention.

Referring now to FIG. 8, the bus-based structure of a crossbar circuit 100–4 is reflected in the arrangement of muitiplexers (MUX) in a multiplexer stage 105(4), in accordance with one embodiment of the present invention. In the present embodiment, the crossbar switch structure 100–4 has eight vertical buses, $A_{0-3}$, $B_{0-3}$, $C_{0-3}$, through $H_{0-3}$ Each bus $A_{0-3}$ through $H_{0-3}$ spans four bits, 0–3.

Each MUX within the MUX stage 105(4), e.g., MUX 105.0(4) through 105.3(4) receives one bit from each bus, such that each MUX has eight inputs.

MUX 105.0(4) receives eight bits, $A_0$ through $H_0$. MUX 105.1(4) receives $A_1$ through $H_1$; MUX 105.2(4) $A_2$ through $H_2$. Similarly, MUX 105.3(4) receives eight bits, $A_3$ through $H_3$. MUXs 105.0(4) through 105.3(4) are all responsive to select line control signals 109a.0(4) through 109a.3(4).

The output of each MUX, e.g., 105.0(4) through 105.3(4) spans one (1) bit, in this embodiment. These outputs are inputted to a permutation device (PERM) 114(4). PERM 114(4) has a single bus input and a single bus output. PERM 114 (4) may be used to connect each bit of its PERM output bus to any bit of its PERM input bus (e.g., different output bits can be connected to different input bits). In this way, it can be used to "permute," e.g., to configure permutationally, the bits within a bus.

It should be appreciated that, unlike the 8-input multiplexers 105.0 through 105.3, the select line of PERM block 114(4) is driven by a programmable configuration bit, in contrast to the MUX stage 105(4) controlling select line control signals, e.g., 109a.0(4) through 109a.3(4). Therefore, once the PLD 1 (FIGS. 3–5) chip embedding crossbar circuit 100–4 has been configured, the connections within PERM block 114(4) will not vary.

Crossbar Circuit Operation

Figure 9:
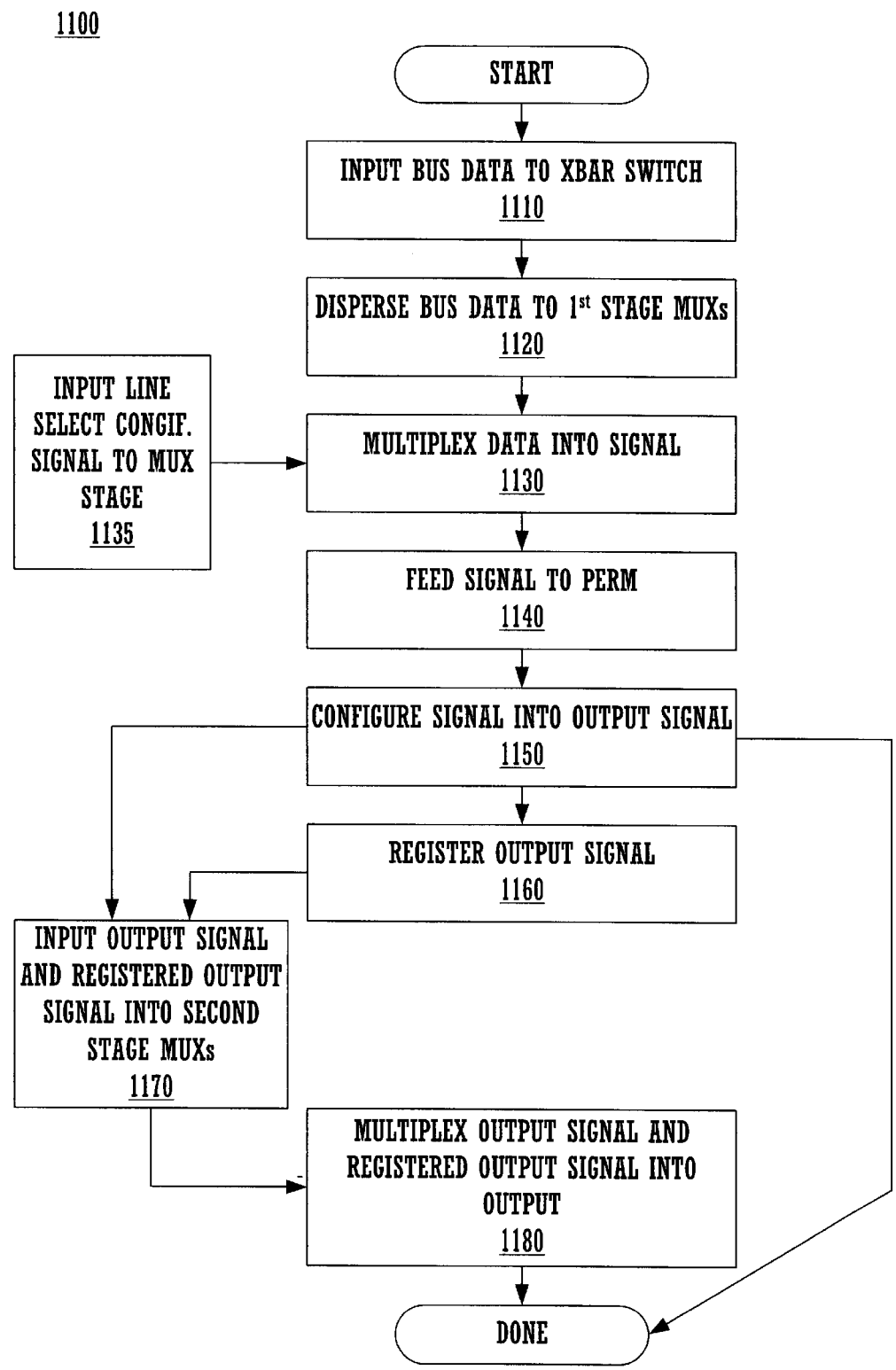
FIG. 9 is a block diagram in the steps of a process 1100 for performing a switching function within a programmable logic device, in accordance with one embodiment of the present invention.

Referring now to FIG. 9, an exemplary process 1100, manifesting an operation of crossbar switching in accordance with one embodiment of the present invention is described. Starting at step 1110, data bits are inputted on a bus-by-bus basis to the crossbar switch.

In one implementation, buses (e.g., vertical buses 101, FIGS. 6, 7) central to the crossbar switch structure (e.g., crossbar structure 100, FIGS. 6, 7) receive input data from respective input buses (e.g., 12.0 through 12.15, FIGS. 6, 7) directly via respective input subcircuits (e.g., 102.0 through 102.15, FIGS. 6, 7).

It should be appreciated that in one embodiment, step 1110 may involve permuting inputs, e.g., in PERM devices (e.g., 103.0 through 103.15, FIG. 7). It should be further appreciated that permuted inputs may be directly inputted to the crossbar switch buses (e.g., 101, FIGS. 6, 7), or alternatively, may be registered, e.g., in latches (e.g., 104.0 through 104.1, FIG. 7). In the alternative implementation, the permuted inputs are multiplexed with the registered permuted inputs, e.g., in MUXs (e.g., 105.0 through 105.15). Input occurs per step 1110 in the alternative implementation, upon the output of these MUXs being supplied to respective crossbar switch buses.

The data on the crossbar switch buses are then disbursed to a first stage, e.g., main multiplexer (MUX) stage (e.g., MUX stages 105.0 through 105.15, FIGS. 6, 7; MUX stage 105(4), FIG. 8), step 1120.

The MUXs constituting this stage (e.g., 105, FIGS. 6, 7) multiplex the data from the buses 101 into a MUX stage 105 output (e.g., 105a.0 through 105a.15, FIG. 7; 105a.0(4) through 105a.3(4), FIG. 8), step 1130. The MUX stage outputs 105a in the present embodiment each span the same number of bits as flowed on each crossbar switch central bus (e.g., buses 101, FIGS. 6, 7; Buses 101–4, FIG. 8); e.g., in one embodiment, each bit is generated by a single, individual MUX, embedded within MUX stage 105 (e.g., MUXs 105.0(4) through 105.3(4), within MUX stage 105(4), FIG. 8).

It should be appreciated that multiplexing per step 1130 may be responsive to MUX stage (e.g. 105.0 through 105.15, FIG. 7) line select configuration signals (e.g., 109a.0 through 109a.15, FIG. 7), step 1135. In one embodiment, line select signals may be received by the MUXs constituting a MUX stage directly via PERM devices (e.g., 111.0 through 111.15, FIG. 7) as the outputs of the PERMs (e.g., 111a.0 through 111a.15, FIG. 7).

Alternatively, in another embodiment, the direct PERM outputs constituting line select configuration signals may be registered, e.g., by a latch (e.g., 112.0 through 112.15, FIG. 7). In this alternative embodiment, the direct PERM output line select configuration signals may be multiplexed with the registered line select configuration signals, e.g., by a MUX (e.g., 113.0 through 113.15, FIG. 7) to form an actual MUX stage (e.g., 105.0 through 105.15, FIG. 7) controlling line select configuration signal.

In the present embodiment, the MUX output signals are fed to a permutation device (PERM; e.g., 114.0 through 114.15, FIG. 7; 114(4), FIG. 8), step 1040.

The PERM configures the signal fed to it from the MUXs into an output signal (e.g., 13.0 through 13.15, FIGS. 6, 7), step 1050. In one embodiment, process 1100 may be done at this point.

Alternatively, in another embodiment, a PERM output signal may be registered, e.g., by inputting to a latch (e.g., 115.0 through 115.15, FIG. 7), step 1060. In the alternative embodiment, both the output signal directly from the PERM output (e.g., 114a.0 through 114a.15, FIG. 7), and the registered PERM output signal are inputted into another, e.g., second stage MUX (e.g., 116.0 through 116.15, FIG. 7), step 1070.

The subsequent, e.g., second stage MUX of the alternate embodiment then multiplexes the PERM output signal and the registered PERM output signal into an output signal (e.g., 13.0 through 13.15, FIGS. 6, 7), step 1180. In that alternate embodiment, at that point, process 1100 is done.

Cascading Crossbar Switches to Implement Large Scale Switching

Many Outputs/Relatively Few Inputs

Figure 10:
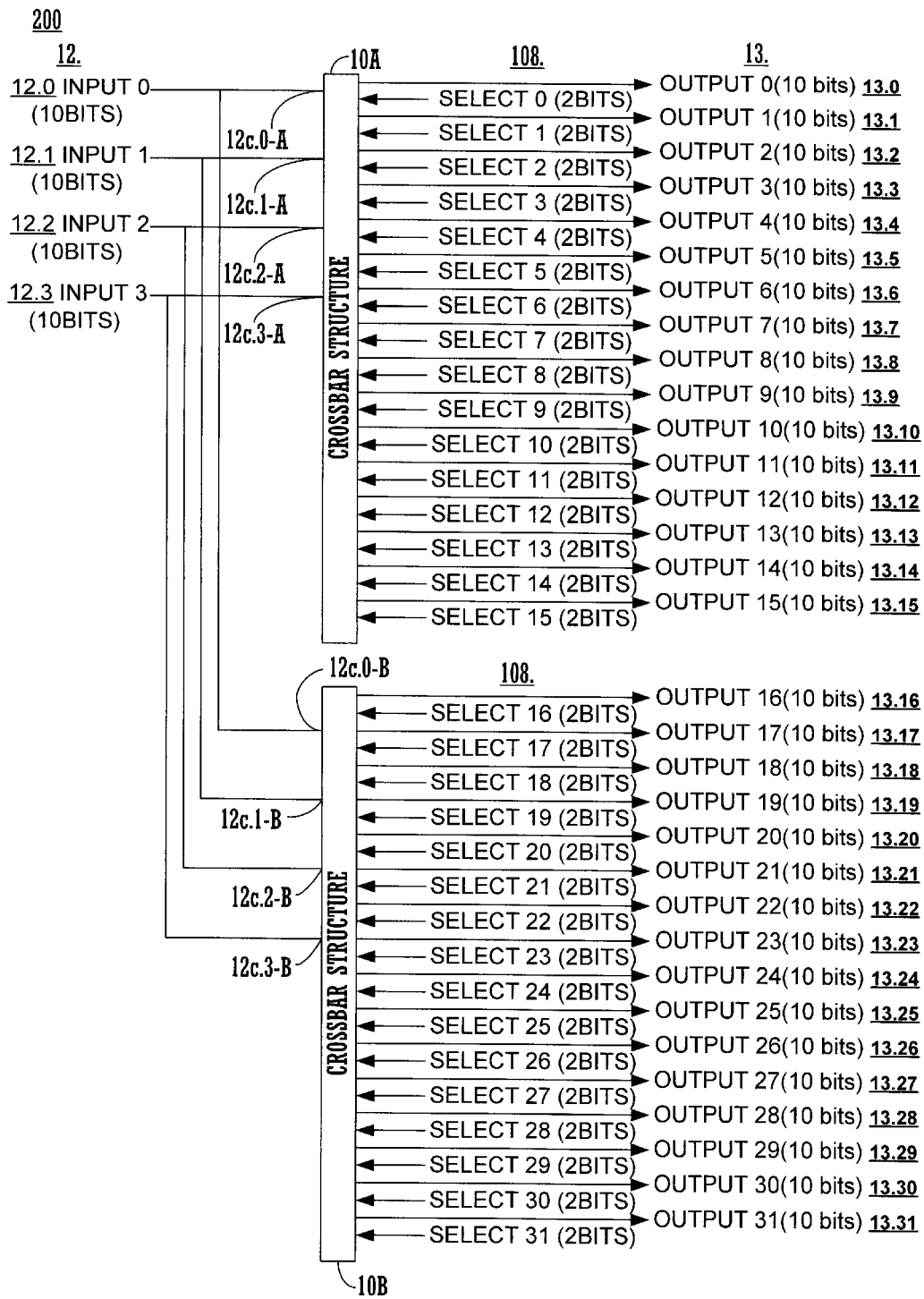
FIG. 10 is a circuit diagram depicting the implementation of a large scale switching function including generating a configured large number of outputs from a smaller number of inputs, through cascading crossbar switching, in accordance with one embodiment of the present invention.

With reference to crossbar switching circuits in programmable logic devices (PLD) in accordance with one embodiment of the present invention, a method of performing larger switching functions, e.g., large scale switching, may be implemented by a circuit wherein a number of inputs is fewer than a number of outputs, wherein further the number of inputs is fewer than the input capacity of crossbar switches embedded in the PLD, and wherein further still the number of outputs is greater than the number of outputs and of the output capacity of a single crossbar switch. FIG. 10 shows a switching function with 4 inputs and 32 outputs, implemented using two crossbar structures in accordance with one embodiment of the present invention. Implementing switching functions in the present embodiment, the corresponding input ports of each crossbar are connected together. Thus, each crossbar then produces 16 of the outputs. In this embodiment, a switching function with n outputs is implemented utilizing n/16 crossbar structures.

With reference to FIG. 10, a large scale switching function is implemented in accordance with the present embodiment by a circuit 200, wherein four (4) inputs 12, e.g., 12.0 through 12.3, are interconnected with 32 outputs 13, e.g., 13.0 through 13.31. In this embodiment, two (2) crossbar structures 10A and 10B integral to circuit 200 implement the switching function enabling this interconnection. Crossbar structures 10A and 10B receive select line configuration signals 108.0 through 108.15, and 108.16 through 108.32, respectively.

The large scale switching function of the present embodiment is implemented in circuit 200 by interconnecting the corresponding input ports 12a.0-A through 12a.3-A of crossbar structure 10A with the corresponding input ports 12a.0-B through 12a.3-B of crossbar structure 10B. This effectively cascades crossbar structures 10A and 10B into a single switching functionality. Each crossbar structure, e.g., 10A and 10B produces 16 of the 32 outputs. In another embodiment, a number n of outputs 13 (e.g., 13.0 through 13.31) may be generated by n/16 crossbar structures.

In an alternative embodiment within a PLD 1 (e.g., FIGS. 3–5), an embedded circuit 200 (e.g., FIG. 10) may be implemented for performing a switching function between s number of inputs 12 (e.g., FIGS. 3, 6, 7, and 10) and u number of outputs 13 (e.g., FIGS. 3, 6, 7, and 10). In the alternative embodiment, circuit 200 integrates a number g of bus based, unidirectional crossbar structures (e.g., 100A and 10B, FIG. 10), each with a number m of input ports 12 (e.g., 12.0-A through 12.3-B and 12.0-B through 12.3-B, FIG. 10) and a number n of output ports 13 (e.g., 13.0 through 13.31, FIG. 10). The g crossbar structures in this alternative embodiment are interconnected cascadingly, being interconnected at their corresponding input ports (e.g., 12a.0-A/12a.0-B through 12a.3-A/12a.3-B, FIG. 10).

In the alternative embodiment, the number g of crossbar structures 10 in circuit 200 may be an integer greater than one. The number s of inputs 12 (e.g., 12.0 through 12.3, FIG. 10) may range from one (1) to the $m^{th}$ multiple of g. Further, in the alternative embodiment, the number of outputs 13, u, is equal to the $n^{th}$ multiple of g.

Many Inputs/Relatively Few Outputs

Figure 11:
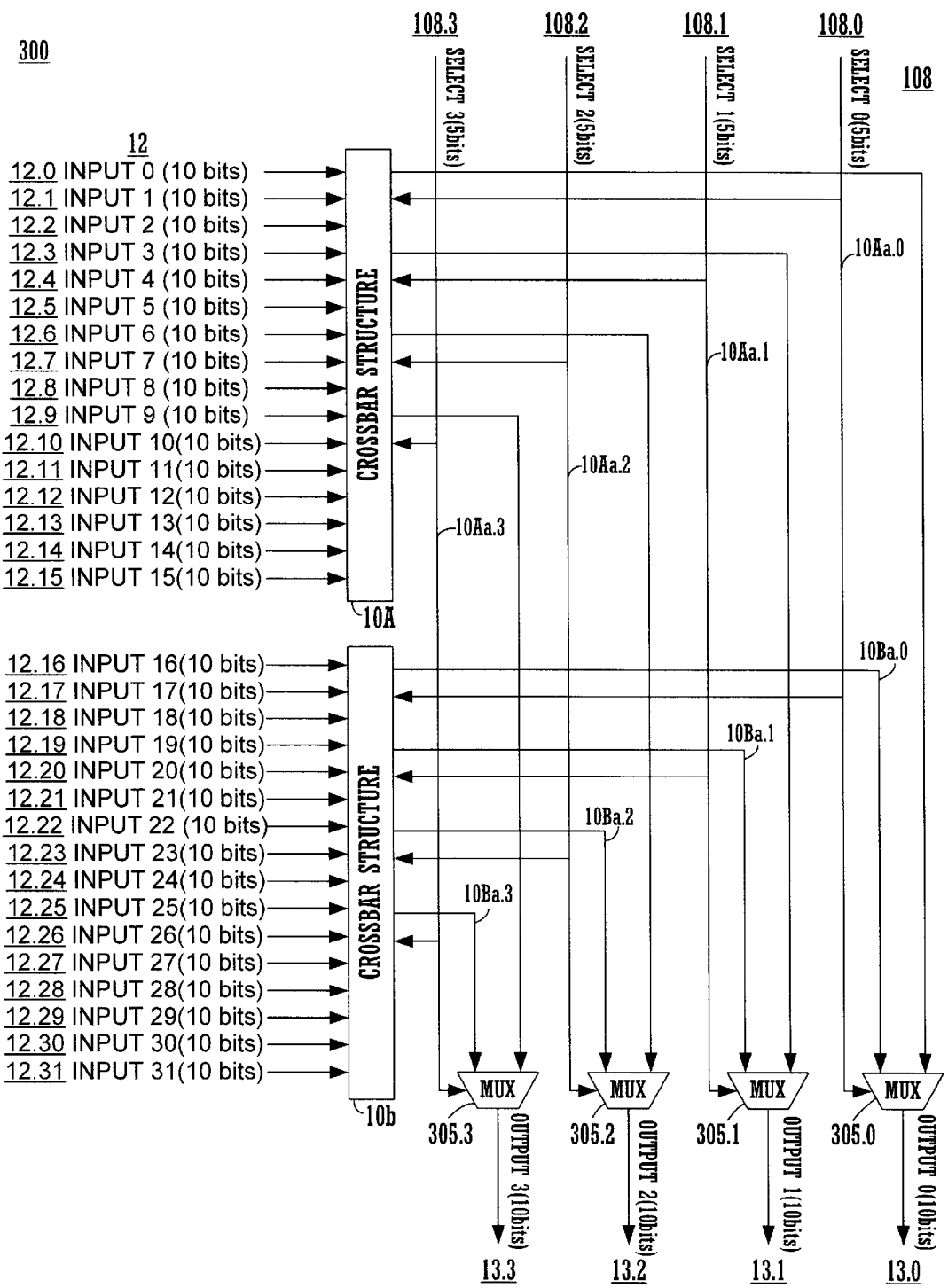
FIG. 11 is a circuit diagram depicting the implementation of a large scale switching function including generating a small, configured number of outputs from a larger, configured number of inputs, through cascading crossbar switching, in accordance with one embodiment of the present invention.

With reference to crossbar switching circuits in programmable logic devices (PLD) in accordance with one embodiment of the present invention, a method of performing larger switching functions, e.g., large scale switching, may be implemented by circuits wherein a number of outputs is fewer than a number of inputs, wherein further the number of outputs is fewer than the output capacity of crossbar switches embedded in the PLD, and wherein further still the number of inputs is greater than the number of outputs and of the input capacity of a single crossbar switch. FIG. 11 shows how a switching pattern with 32 inputs and 4 outputs may be implemented. In the present embodiment, two crossbar structures are utilized.

To implement switching functions in accordance with the present embodiment, a switching pattern with n inputs and m outputs (where m is less than or equal to 16) utilizes n/16 crossbar structures and m output multiplexers. Each crossbar structure thus selects between sixteen input buses. Further, the present embodiment utilizes m output multiplexers. Each multiplexer is fed by a single bus from each crossbar structure, and selects one of its n/16 bus inputs. The selected bus becomes an output of the switching pattern. In addition to the n inputs and m outputs, the switching pattern utilizes m select buses, each with $\log_2(n)$ bits. Four of these bits are used to control each crossbar structure, while the remaining bits are used to control the output multiplexers.

With reference to FIG. 11, a large scale switching function is implemented in accordance with one embodiment of the present invention by a circuit 300, wherein 32 inputs 12, e.g., 12.0 through 12.31, are interconnected with four (4)

outputs 13, e.g., 13.0 through 13.3. In this embodiment, two (2) crossbar structures 10A and 10B integral to circuit 300 implement the switching function enabling this interconnection, which is also facilitated by four (4) output multiplexers (MUXs) 305, e.g., 305.0 through 305.3. Crossbar structures, 10A and 10B each receive select line configuration signals 108.0 through 108.3.

In the present embodiment, the four output multiplexers 305, e.g., 305.0 through 305.3, each select between a bus from crossbar switch 10A and a bus from crossbar switch 10B. In this way, the output, e.g., 13.0 through 13.3, of the output multiplexer 305, e.g., 305.0 through 305.3, may be connected to any input bus 12, e.g., 12.0 through 12.31. The selection is controlled by four 5-bit select line configuration buses, 108.0 through 108.3. Four of the five lines in each select line configuration bus 108 are used to select one of sixteen inputs within each crossbar structure 10, e.g., 10A and 10B. In the present embodiment, each of the two crossbar structures, 10A and 10B receives the same four bits from each select line configuration bus. The fifth bit of each select line configuration buses 108.0 through 108.3 is used to control the corresponding output multiplexer, 305.0 through 305.3, connected to that select line configuration bus.

In one embodiment, the output multiplexers 305.0 through 305.3 may be implemented using general-purpose PLD logic 4 (FIGS. 4, 5). Alternatively, in another embodiment, output multiplexers 305.0 through 305.3 may be implemented using a third crossbar structure 10.

In one embodiment, a switching pattern with a number n of inputs 12 (e.g., 12.0 through 12.31), and a number m of outputs 13 (e.g., 13.0 through 13.3), wherein m is less than or equal to 16, n/16 crossbar structures 10 (e.g., 10A and 10B) and m output multiplexers 305 (e.g., 305.0 through 305.3) are utilized to implement switching circuit 300. Each crossbar structure 10 (e.g., 10A and 10B) is used to select between n input buses 12 (e.g., 12.0 through 12.15, and 12.16 through 12.32, respectively).

In the present embodiment, there are m output multiplexers 305 (e.g., 305.0 through 305.3); each multiplexer 305 fed by a single corresponding bus (e.g., 10A$a$.0 through 10A$a$.3 and 10B$a$.0 through 10B$a$.3) from each crossbar structure (e.g., 10A and 10B). Each output multiplexer 305 (e.g., 305.0 through 305.3) selects one of its corresponding n/16 bus MUX inputs (e.g., 10A$a$.0 through 10A$a$.3 and 10B$a$.0 through 10B$a$.3). The selected bus (e.g., 10A$a$.0 through 10A$a$.3 and 10B$a$.0 through 10B$a$.3) becomes an output 13 (e.g., 13.0 through 13.3) of the switching pattern enabled by circuit 300.

In addition to the n inputs 12 and m outputs 13, the switching pattern enabled by circuit 300 in the present embodiment may utilize m select line configuration buses (e.g., 108.0 through 108.3), each with $\log_2(n)$ bits. These bits may control each crossbar structure 10 (e.g., 10A and 10B), as well as the output multiplexers 305 (e.g., 305.0 through 305.3).

In one embodiment, a circuit 300 implements a method of performing a large scale switching function by cascading a number g of crossbar switches 10 (e.g., 10A and 10B), wherein g is an integer greater than one. Each of the g crossbar switches 10 may have a number n of input ports 12$a$ (e.g., FIG. 3). In this embodiment, circuit 300 may have a number s of inputs 12 (e.g., 12.0 through 12.31) equal to the $n^{th}$ multiple of g. Circuit 300 has a number u of outputs 13 (e.g., 13.0 through 13.3), wherein u ranges from one (1) through the $m^{th}$ multiple of g, inclusive.

In the present embodiment, circuit 300 and its large scale switching capability may be enabled by the cascading of the g crossbar switches 10 (e.g., 10A and 10B). Crossbar switches may be cascaded in this embodiment by interconnection of their corresponding individual outputs (e.g., 10A$a$.0 through 10A$a$.3 and 10B$a$.0 through 10B$a$.3, respectively) at inputs of a number u of multiplexers (MUXs) 305 (e.g., 305.0 through 305.3).

Each of the u MUXs 305 multiplex signals from corresponding individual outputs (e.g., 10A$a$.0 through 10A$a$.3 and 10B$a$.0 through 10B$a$.3, respectively) of each crossbar switch 10. Thus, u outputs 13 are generated.

In the present embodiment, the MUXs 305 and the crossbar structures 10 are under control of u corresponding select line configuration signals 108.

Many Inputs/Many Outputs

Figure 12:
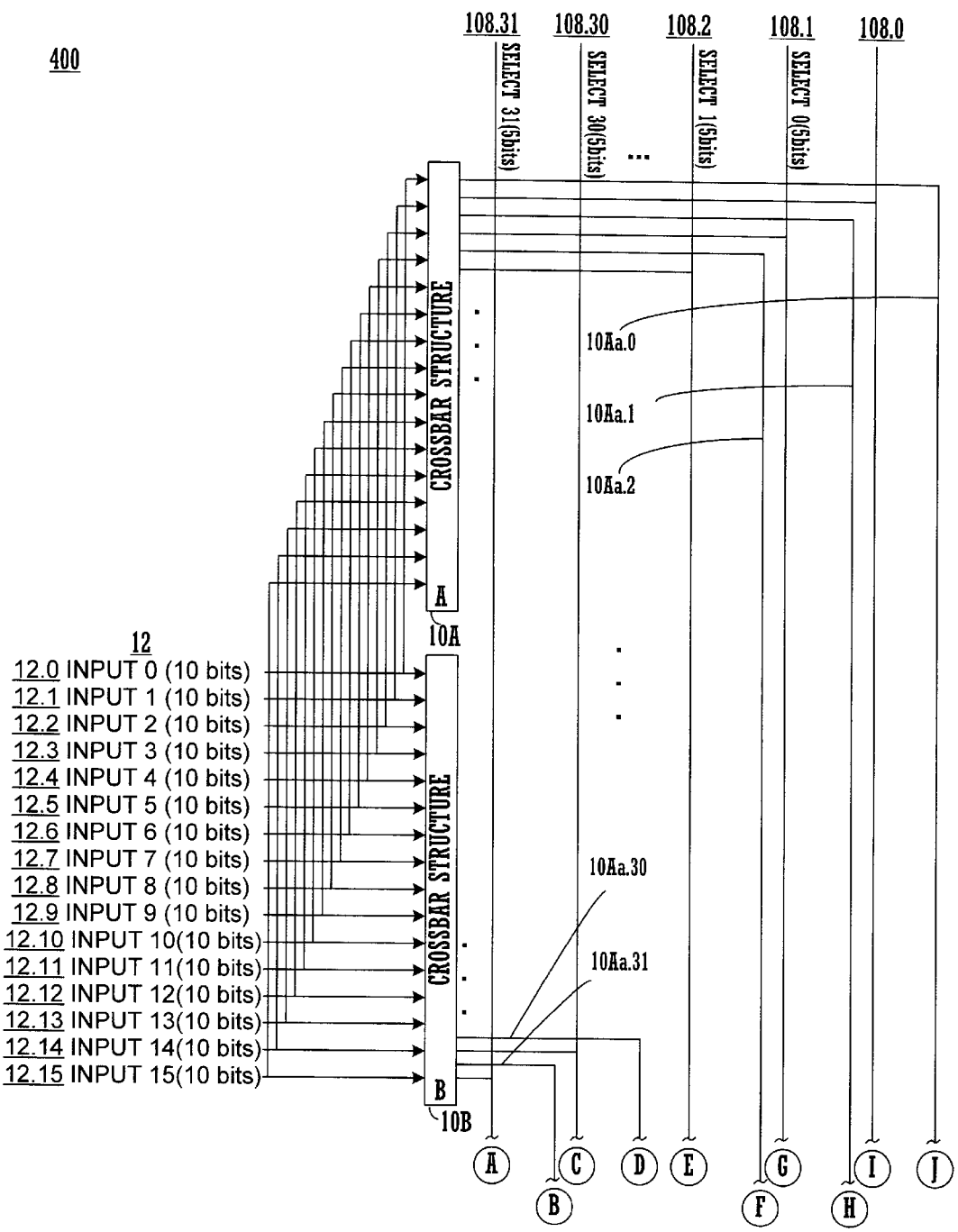
FIG. 12 is a circuit diagram depicting the implementation of a very large scale switching function including generating a configured large number of outputs from a configured large number of inputs, through cascading crossbar switching, in accordance with one embodiment of the present invention.
Figure 12:
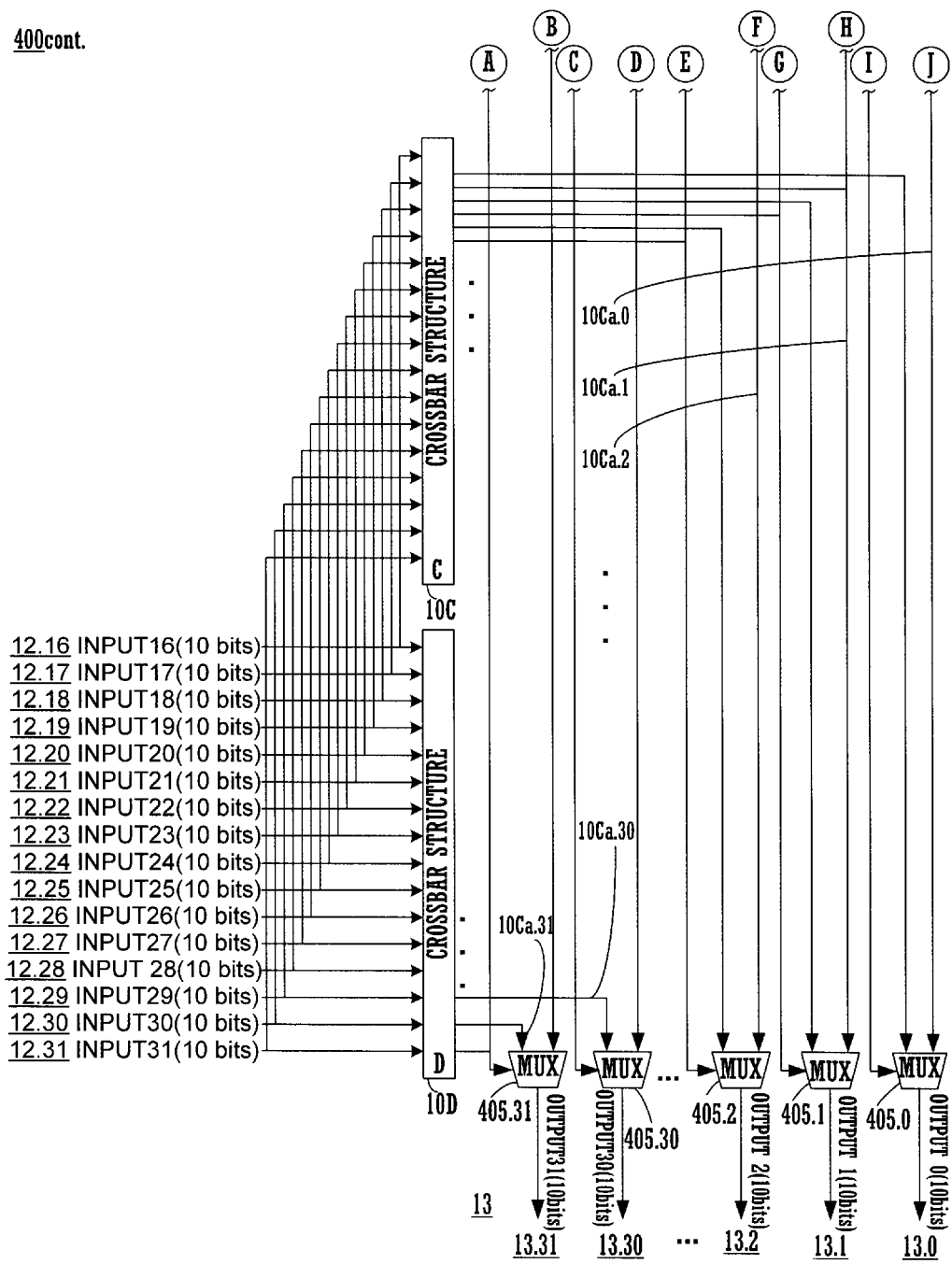

With reference to crossbar switching circuits in programmable logic devices (PLD) in accordance with one embodiment of the present invention, a method of performing larger switching functions, e.g., large scale switching, may be implemented by circuits wherein a number of inputs and a number of outputs are both greater than the respective capacities of individual crossbar switches embedded in the PLD. FIG. 12 shows how a switching pattern with 32 inputs and 32 outputs may be implemented, in accordance with one embodiment of the present invention. In this case, four crossbar structures are utilized.

The corresponding input buses of crossbar structures are interconnected in individual pairs. Thus, together, each crossbar structure pair selects 32 output buses, each from separate, single sets of 16 input buses. Further, in the present embodiment, there are also 32 output multiplexers, each with two bus inputs; one from one of crossbar structure pair, and the other from the opposite, corresponding crossbar structure pair. In the present embodiment, output multiplexers may be implemented using either general-purpose PLD logic or additional crossbar structures.

In the present embodiment, to implement a switching pattern with n inputs and m outputs (where n and m are both larger than 16), $(n/16) \times (r/16)$ crossbar structures and m output multiplexers are utilized. The crossbar structures are grouped into n/16 groups of m/16; each group selects m buses from 16n/m input buses. One bus from each group is then fed into each output multiplexer. Each output multiplexer selects one of its n/16 bus inputs; the selected bus becomes an output of the switching pattern. In addition to the n inputs and m output buses, the switching pattern requires m select buses, each with $\log_2(n)$ bits. Four of these bits are used to control each group of crossbar structures, while the remaining bits are used to control the output multiplexers.

With reference to FIG. 12, a large scale switching function is implemented in accordance with one embodiment of the present invention by a circuit 400, wherein 32 inputs 12, e.g., 12.0 through 12.31, are interconnected with 32 outputs 13, e.g., 13.0 through 13.31. In this embodiment, four (4) crossbar structures 10A, 10B, 10C, and 10D, all integral to circuit 400, implement the switching function enabling this interconnection, which is also facilitated by 32 output multiplexers (MUXs) 405, e.g., 405.0 through 405.31.

In the present embodiment, crossbar structures, 10A through 10D are cascaded by interconnection in pairs; 10A and 10B constitute a first pair, and 10C and 10D constitute a second pair. Each pair receives corresponding select line configuration signals 108.0 through 108.31; 108.0 through 108.15 to the first crossbar switches, 10A and 10C, of each pair, and 108.16 through 108.31 to the second crossbar switches, 10B and 10D, of each pair.

In the present embodiment, the switching pattern with 32 inputs and 32 outputs can be implemented by cascading the four crossbar structures 10 in two pairs by, first, interconnecting corresponding input buses 12; the input buses of crossbar structure 10A are tied to the corresponding input buses of crossbar structure 10B, while the input buses of crossbar structure 10C are tied to the corresponding input buses of crossbar structure 10D. Thus, together, crossbar structures 10A and 10B select 32 output buses 13 (e.g., 13.0 through 13.31) from input buses 12.0 to 12.15, while crossbar structures 10C and 10D select 32 output buses 13 (e.g., 13.0 through 13.31) from input buses 12.16 to 12.31.

The switching pattern is further implemented by the present embodiment by utilizing 32 output multiplexers (MUX) 405 (e.g., 405.0 through 405.31) to complete the cascading of crossbar switches 10. Each output multiplexer 405 has two bus inputs (e.g., 10A$a$ and 10C$a$). One bus input 10A$a$ comes from one crossbar structure pair constituted by crossbar structures 10A and 10B; the second input bus comes from the second crossbar structure pair, e.g., the pair constituted by crossbar structures 10C and 10D.

In one embodiment, output multiplexers 405.0 through 405.31 may be implemented using either general-purpose PLD logic elements 4 (FIGS. 4, 5). Alternatively, in another embodiment, additional crossbar structures 10 may be utilized to implement output MUXs (e.g., 405.0 through 405.31). In yet another embodiment, a dedicated cascaded crossbar switching output MUX stage may implement output MUXs, e.g., 405.0 through 405.31.

In one embodiment, a switching pattern with a number n of inputs 12 (e.g., 12.0 through 12.31) and a number m of outputs 13 (e.g., 13.0 through 13.31), wherein both n and m are integers larger than 16, is implemented by cascading (n/16)×(m/16) crossbar structures 10 (e.g., 10A through 10D) and m output multiplexers 405 (e.g., 405.0 through 405.31). Crossbar structures 10 (e.g., 10A through 10D) are grouped into n/16 groups of m/16; each group selecting m buses $10_{13}$ a (e.g., 10A$a$.0 through 10A$a$.31 and 10C$a$.0 through 10C$a$.31) from n/16 input buses 12 (e.g., 12.0 through 12.31). One bus from each group is then fed into each output multiplexer 405, e.g., in one implementation, each MUX 405 receives one input via bus group 10A$a$ and one input from bus group 10C$a$.

Each output multiplexer 405 (e.g., 405.0 through 405.31) selects one of its n/16 bus inputs; the selected bus becomes an output 13 (e.g., 13.0 through 13.31) of the switching pattern enabled by circuit 400.

In one embodiment, the switching pattern enabled by circuit 400 utilizes m select line configuration buses 108 (e.g., 108.0 through 108.31), each with $\log_2$ (n) bits. These bits are used to control each group of crossbar structures 10 (e.g., 10A/10B, and 10C/10D), as well as to control the output multiplexers 405 (e.g., 405.0 through 405.31).

In one embodiment, a circuit 400 implements a method of performing a large scale switching function by cascading a number g of crossbar switches 10 (e.g., 10A through 10D) wherein g is an even integer greater than two. Each crossbar switch 10 may have a number n of input ports 12$a$ (e.g., FIG. 3) and of output ports 13$a$ (e.g., FIG. 3). In the present embodiment, Circuit 400 may have a number s of inputs 12 (e.g., 12.0 through 12.31) and a number u of outputs 13 (e.g., 13.0 through 13.31). The numbers s and u are both greater than n; in one implementation, s and u may both be equal to the $n^{th}$ multiple of g/2.

In the present embodiment, crossbar structures 10 are cascaded by a scheme wherein the corresponding input ports 12$a$ (e.g., FIG. 3) of each crossbar switch 10 within each pair (e.g., 10A–10B, and 10C–10D) are interconnected directly. Further, in the present cascading scheme, respective output ports 13$a$ (e.g., FIG. 3) of each corresponding crossbar switch 10 from each opposite pair (e.g., 10A–10C and 10B–10D) are interconnected at u multiplexers (MUX) 405 (e.g., 405.0 through 405.31).

MUXs 405 each multiplex corresponding buses (e.g., 10A$a$.0–10C$a$.0 through 10A$a$.31–10C$a$.31) respectively and generate u outputs. The MUXs 405 (e.g., 405.0 through 405.31), are under control of u corresponding select line configuration signals 108 (e.g., 108.0 through 108.31, respectively).

By cascading crossbar switches in accordance with an embodiment of the present invention, much larger switching functions may be conveniently and efficiently implemented, than are conventionally feasible in programmable logic devices.

In summary, the present invention provides a configurable circuit which allows bus based switching of data streams within programmable logic devices wherein data is switched at a bus level, each bus in its entirety, and which is optimized for switching many larger buses. The present invention also provides a circuit which performs switching within programmable logic devices wherein higher performance is achieved by limiting data flow, from input to output, to a single direction. Further, the present invention provides a method and circuit thereof for cascading programmable logic device switching circuits with other such circuits, which enables switching on a scale much larger than would be possible with conventional switching. Further still, the present invention provides a switching circuit for programmable logic devices which is configurable for designating a specific, fixed output signal order relative to the input signals.

In accordance with one embodiment of the present invention, a configurable crossbar switching circuit is enabled within a programmable logic device which is capable of performing efficient, relatively large scale switching functions. In one embodiment of the invention, the crossbar switch is integral to a programmable logic device. In one embodiment, the crossbar switching circuit is bus based, switching all of the conductors constituting a data bus substantially simultaneously and in their entirety as a bus unit. In one embodiment, the crossbar switching circuit performs switching operations unidirectionally. In one embodiment, the crossbar switching circuit is cascadable. For the implementation of large scale switching functions utilizing the crossbar circuit, one embodiment of the present invention exploits the cascadable character of the circuit. In one embodiment, a permutation subcircuit allows the configuration of signals within the crossbar switch to a designated, programmed sequence and specific order.

Thus, the present invention provides a circuit and method that can implement a switching function in a programmable logic device which is bus based, e.g., not performing switching on individual conductors, unidirectional, cascadable to implement large scale switching functions, configurable, and which has permutable configurations. In addition, the present invention provides a circuit and method that is considerably more efficient and operates at a higher switching density, and is significantly faster than conventional applications of logic elements for switching in programmable logic devices.

An embodiment of the present invention, a configurable, bus based, unidirectional, cascadable crossbar switching circuit and method in a programmable logic device with permutational capabilities is thus described. While the present invention has been described in particular embodiments, it should be appreciated that the present invention should not be construed as limited by such embodiments, but rather construed according to the below claims.

What is claimed is:

1. A programmable logic device comprising:
   a) programmable logic;
   b) an input/output stage;
   c) routing fabric; and
   d) a switching circuit that is bus based and unidirectional, wherein said switching circuit comprises a crossbar switch.

2. The programmable logic device as recited in claim 1 wherein said crossbar switch comprises:
   a first plurality of buses, wherein each bus of said first plurality spans a second plurality of bits;
   a third plurality of input stages equal in number to said first plurality;
   a fourth plurality of output stages equal in number to said first plurality, wherein each output stage of said fourth plurality is equal in number to said second plurality.

3. The programmable logic device as recited in claim 2 wherein said crossbar switch comprises:
   a) n buses, each of said buses spanning p bits, 0 through (p−1);
   b) n input stages; and
   c) n output stages, each of said output stages spanning p bits, 0 through (p−1); wherein n and p are integers greater than 1.

4. The programmable logic device as recited in claim 3 wherein each of said output stages comprises:
   a) p first multiplexers, arrayed in a sequence spanning 0 through (p−1), wherein each of said first multiplexers take one input from each of said n buses in accordance with said sequence, and multiplex said inputs into a single signal; and
   b) p first devices arrayed to accept a plurality of said signals, wherein said first devices configure said plurality of said signals into an output signal having a selective permutational order from 0 through (p−1) corresponding to a first programmable configuration bit; wherein p is an integer greater than 1.

5. The programmable logic device as recited in claim 4 wherein each of said output stages further comprises:
   a) p first latches wherein each of said latches is arrayed to register said output signal and provide a registered output signal; and
   b) p second multiplexers wherein said second multiplexers multiplex said output signal and said registered output signal, according to a second programmable configuration bit, to generate a stage output signal; wherein p is an integer greater than 1.

6. The programmable logic device as recited in claim 4 wherein said first multiplexers operate under control of a select line configuration signal wherein said select line configuration signal is provided to said first multiplexers by a circuit comprising:
   a) r second devices arrayed to accept r select line control signals, wherein said second devices configure said select line control signals into a select line configuration control signal having a selective permutational order corresponding to a third programmable configuration bit;
   b) r second latches wherein each of said latches is arrayed to optionally register said select line configuration control signal and provide a registered select line configuration control signal; and
   c) r third multiplexers, wherein said third multiplexers multiplex said select line configuration control signal and said registered select line configuration control signal, according to a fourth programmable configuration bit; wherein r is an integer greater than 1.

7. A bus based, unidirectional programmable logic device comprising:
   a) programmable logic;
   b) an input/output stage;
   c) routing fabric; and
   d) a plurality of bus based, unidirectional switching circuits, wherein said switching circuits are cascadable to perform a switching function selected from the group consisting of:
      interconnecting a number of output ports with a number of input ports, wherein said number of output ports is greater than said number of input ports;
      interconnecting a number of output ports with a number of input ports, wherein said number of input ports is greater than said number of output ports; and
      interconnecting a number of output ports with an equal number of input ports, wherein said number of output ports and said number of input ports exceeds said capacity of one of said plurality of switching circuits.

8. The programmable logic device as recited in claim 7 wherein said switching circuits are crossbar switches.

9. The programmable logic device as recited in claim 8 wherein each of said crossbar switches comprises:
   a) n buses, each of said buses spanning p bits, 0 through (p−1);
   b) n input stages; and
   c) n output stages, each of said output stages spanning p bits, 0 through (p−1); wherein n and p are integers greater than 1.

10. The programmable logic device as recited in claim 9 wherein each of said output stages comprises:
    a) p first multiplexers, arrayed in a sequence spanning 0 through (p−1), wherein each of said first multiplexers take one input from each of said n buses in accordance with said sequence, and multiplex said inputs into a single signal; and
    b) p first devices arrayed to accept a plurality of said signals, wherein said first devices configure said plurality of said signals into an output signal having a selective permutational order from 0 through (p−1) corresponding to a first programmable configuration bit; wherein n and p are integers greater than 1.

11. The programmable logic device as recited in claim 10 wherein each of said output stages further comprises:
    a) p first latches wherein each of said latches is arrayed to register said output signal and provide a registered output signal; and
    b) p second multiplexers wherein said second multiplexers multiplex said output signal and said registered output signal, according to a second programmable configuration bit, to generate a stage output signal; wherein p is an integer greater than 1.

12. The programmable logic device as recited in claim 10 wherein said first multiplexers operate under control of a select line configuration signal wherein said select line configuration signal is provided to said first multiplexers by a circuit comprising:

a) r second devices arrayed to accept r select line control signals, wherein said second devices configure said select line control signals into a select line configuration control signal having a selective permutational order corresponding to a third programmable configuration bit;

b) r second latches wherein each of said latches is arrayed to optionally register said select line configuration control signal and provide a registered select line configuration control signal; and c) r third multiplexers, wherein said third multiplexers multiplex said select line configuration control signal and said registered select line configuration control signal, according to a fourth programmable configuration bit; wherein r is an integer greater than 1.

13. In a programmable logic device comprising programmable logic, an input bus, an output bus, routing fabric, and a bus based, unidirectional crossbar switching circuit, a method of switching data, comprising:

receiving said data from said input bus by said bus based, unidirectional crossbar switching circuit;

disbursing said data to a first stage of multiplexers comprising said bus based, unidirectional crossbar switching circuit;

inputting a line select configuration signal to said first stage of multiplexers;

multiplexing said data into a signal, wherein said multiplexing is performed according to said line select configuration signal; and permutating said signal into an output signal.

14. The method as recited in claim 13, further comprising registering said output signal into a registered output signal.

15. The method as recited in claim 14, further comprising:

inputting said output signal and said registered output signal into a second stage of multiplexers; and multiplexing said output signal and said registered output signal into an output.

16. The method as recited in claim 13 wherein said line configuration signal is selected from the group consisting essentially of a permutated line configuration signal, and a multiplexed signal comprising said permutated line configuration signal and a registered permutated line configuration signal.

* * * * *